US010156600B2

(12) United States Patent
Märtens et al.

(10) Patent No.: US 10,156,600 B2
(45) Date of Patent: Dec. 18, 2018

(54) METHOD AND DEVICE FOR IMPEDANCE ANALYZER WITH BINARY EXCITATION

(71) Applicant: Tallinn University of Technology, Tallinn (EE)

(72) Inventors: Olev Märtens, Tallinn (EE); Raul Land, Tallinn (EE); Mart Min, Harju maakond (EE); Paul Annus, Tallinn (EE); Marko Reidla, Tartu maakond (EE)

(73) Assignee: TALLINN UNIVERSITY OF TECHNOLOGY, Tallinn (EE)

( * ) Notice: Subject to any disclaimer, the term of this patent is extended or adjusted under 35 U.S.C. 154(b) by 80 days.

(21) Appl. No.: 15/132,381

(22) Filed: Apr. 19, 2016

(65) Prior Publication Data

US 2016/0305996 A1  Oct. 20, 2016

(30) Foreign Application Priority Data

Apr. 20, 2015 (EE) .................................. 201500014

(51) Int. Cl.
*G01R 23/00* (2006.01)
*G01R 27/02* (2006.01)

(52) U.S. Cl.
CPC ............. *G01R 27/02* (2013.01); *G01R 23/00* (2013.01)

(58) Field of Classification Search
CPC .......... G01R 27/02; G01R 27/26; G01R 1/30; G01R 27/16; G01R 27/00; G01R 23/00
See application file for complete search history.

(56) References Cited

U.S. PATENT DOCUMENTS

| 7,706,872 | B2* | 4/2010 | Min | A61B 5/053 |
| | | | | 324/525 |
| 2003/0187636 | A1* | 10/2003 | Klippel | H04R 29/001 |
| | | | | 704/220 |
| 2011/0095747 | A1* | 4/2011 | Min | G01N 27/026 |
| | | | | 324/76.39 |

(Continued)

OTHER PUBLICATIONS

Min et al, "Rectangular wave excitation in Wideband bioimpedance spectroscopy", IEEE International Workshop on the Medical Measurements and Applications, pp. 268-271, May 29-30, 2009.

(Continued)

*Primary Examiner* — Jermele M Hollington
*Assistant Examiner* — Suresh K Rajaputra
(74) *Attorney, Agent, or Firm* — Berggren LLP

(57) ABSTRACT

Method and device for impedance analyzer with binary excitation with improved accuracy, where the non-idealities of the sampling and preprocessing of the response signal (including aliasing effects) are taken into account by using of the overall system model with equivalent circuit diagrams of the analyzed object and the model of the preliminary analysis of the response signal. The analysis result is the equivalent circuit diagram with component values with the best match of the overall model analysis and of the preliminary analyze of the response signal. Further, the analysis result can be the impedance frequency characteristic or the classifier of the analyzed object. It could be reasonable to use the pre-calculated function (e.g. in the form of the look-up-table) for matching the results of the over-all model against the preliminary analyzed results of the response signal.

7 Claims, 3 Drawing Sheets

(56) References Cited

U.S. PATENT DOCUMENTS

| | | | |
|---|---|---|---|
| 2012/0245873 A1* | 9/2012 | Donnangelo | G01N 22/00 |
| | | | 702/65 |
| 2013/0054178 A1* | 2/2013 | Land | G01R 27/28 |
| | | | 702/109 |
| 2014/0025327 A1* | 1/2014 | Lindqvist | H04B 3/466 |
| | | | 702/65 |

OTHER PUBLICATIONS

Kubendran R. et al., "Error correction Algorithm for High Accuracy bio-impedance measurement in Wearable Healthcare Applications", IEEE Trans Biomed Circuits Syst. 2014, 8 (2); 196-205.
T. Floyd, "Digital Fundamentals", 2008, 12.

* cited by examiner

METHOD AND DEVICE FOR IMPEDANCE ANALYZER WITH BINARY EXCITATION

PRIORITY

This application claims priority of Estonian National application number PI201500014 filed on Apr. 20 2015 the contents of which is incorporated herein by reference.

TECHNICAL FIELD

The invention belongs to the field of the measurement techniques, more precisely to the analysis of the impedance of the AC complex networks and determination of the properties of the electrical circuits, various materials and tissues.

BACKGROUND ART

There are known high precision and wide-band impedance- (or more generally electric network) analyzers (e.g. E4990A Impedance Analyzer of Keysight Inc). These devices have large dimensions, they are bulky, expensive and the analysis of the impedance of the electric networks or other parameters is time consuming by this device.

One way to greatly simplify the solution is to use in the analysis instead of the sinewave-based ("harmonic") excitation signal a simple binary (rectangular) or other approximated by steps signals (M. Min, et al, "Rectangular wave excitation in Wideband bioimpedance spectroscopy," *IEEE International Workshop on the Medical Measurements and Applications*, pp. 268-271, May 29-30, 2009). This solution has the disadvantage, that such signal has a very broad frequency spectra—with additional to the main frequency other harmonics, which in turn during the sampling process of the response signal causes due to alias-frequencies (as combinations of multiples of sampling rate frequencies and all frequency components of the measurement signal) significant errors in the analysis of the signal and consequently of the object under test. To reduce such error for such bipolar pulsed excitation signal it has been proposed in the U.S. Pat. No. 7,706,872 to equate to zero certain parts of the signal (so-called pulse shortening). This solution reduces only partially the error of analysis because it allows compensate only for a very small number of harmonics and possible alias-frequencies.

There is known a solution (Kubendran R. et al, "Error Correction Algorithm for High Accuracy bio-impedance measurement in Wearable Healthcare Applications", IEEE Trans Biomed Circuits Syst. 2014, 8 (2): 196-205), which carries out the analysis of the error estimation and correction based on the equivalent circuit diagram of the measured object. The disadvantage of this solution is that the used simple pulsed (rectangular) signal comprises only one fundamental frequency and its integer harmonics with decreasing amplitudes that does not allow any use of the predetermined spectra of the excitation signal. This narrows significantly the usage of the device and accuracy of the analysis. Also, such solution is based only on one possible equivalent circuit diagram, which does not allow analyzing different circuits. A partial solution could also be adding of the high-order analog low-pass filter to the path of the response signal, to limit the frequency spectra of the response signal to the half of the sampling rate and so avoid the aliasing effect (T. Floyd, "Digital Fundamentals", 2008, 12). However, such solution increases the price, complexity and adds (mainly linear) distortions and inaccuracies into the signal path, and thus to the analyzing process.

The closest solution is disclosed in the patent EE05668B1 (published also as US2013054178), where sophisticated binary excitations signal is generated, wherein the waveform (pattern) of the signal can be selected according to the desired spectrum. Thus, it is possible to reduce the impact of aliasing frequencies. However, since pulsed signal having infinite spectra is used, which in addition to the desired frequencies contains also a lot of harmonic components and so significant errors occur during the sampling and analysis of the response signal.

SUMMARY OF THE INVENTION

The aim of the invention is significant reduction of the error of the impedance analysis, if binary (or approximated by any other set of discrete levels) excitation signal is used. The aim of the invention is achieved, compared to the known solution, which contains a generation of the binary (or with other discrete levels) excitation signal and the initial analysis of the response signal, characterized by the introduction of the additional means for frequency characteristic estimation, which in turn comprises:

estimation means of the parameters of the object under test for which the input values are also the input values of the overall frequency characteristic estimation means, which values are obtained from the initial analysis of the response signal, and an output result of the estimation means of the parameters of the object under test is also the output of the overall frequency characteristic estimation means;

generation of the parameters of the model, controlled by the output of the estimation of the parameters of the object under test;

the model of the preliminary analysis of the response signal, which receives the parameters of the model from the generating means of the model parameters, wherein a input of the model is the excitation waveform, and the output of the model of the preliminary analysis controls the estimation of the parameters of the analyzed object, wherein such parameters of the analyzed object are determined, for which the results of the preliminary analysis of the response signal are most similar to the results of the model of the preliminary analysis of the response signal.

It is reasonable, that possible parameters of the said model consist of the suggested electric circuit diagrams and the possible component values of these circuit diagrams (LCR).

The maximum similarity of the results of the initial analysis of the response signal and of the model of the initial analysis of the response signal are determined by some parameter of these complex result values (magnitude, phase, real or imaginary part, or a combination thereof), by the lowest standard deviation.

In addition, the model of the initial analysis of the response signal can contain the corrections of the real-life initial analysis of the response signal, which are obtained from the theoretical or experimental studies for this part. The estimation of the frequency characteristic can be carried out in the form of the pre-calculated table(s) to issue the classification parameters.

This solution can be realized as a device that includes the generator of the binary (or using other discrete levels) excitation signal, applied to the object under test, and the initial analyzer of the response signal, characterized in that to the solution it is added the estimator of the frequency characteristic comprising:
  estimator of the parameters of the object under test, input of which is also the input of the estimator of the frequency characteristic, both connected to the output of the initial analyzer of the response signal, and the output of the said estimator of the parameters of the object under test is also the output of the overall estimator of the frequency characteristic;
  the generator of the parameters of the model, input of which is connected to the output of the estimator of the frequency characteristic;
  the model of the initial analyzer of the response signal, which input for the model parameters is connected to the generator of the parameters of the model; and the other input for this said model is connected to the output of the initializer of the excitation signal; and the output of said model of the initial analyzer of the response signal is connected to the output of the estimator of the parameters of the object under test, which determines such parameters of the object under test, for which the output result of the initial analyzer of the response signal is most similar to the output result of the model of the initial analyzer of the response signal, minimizing the difference between them.

DETAILED DESCRIPTION OF THE INVENTION

Figure 1:
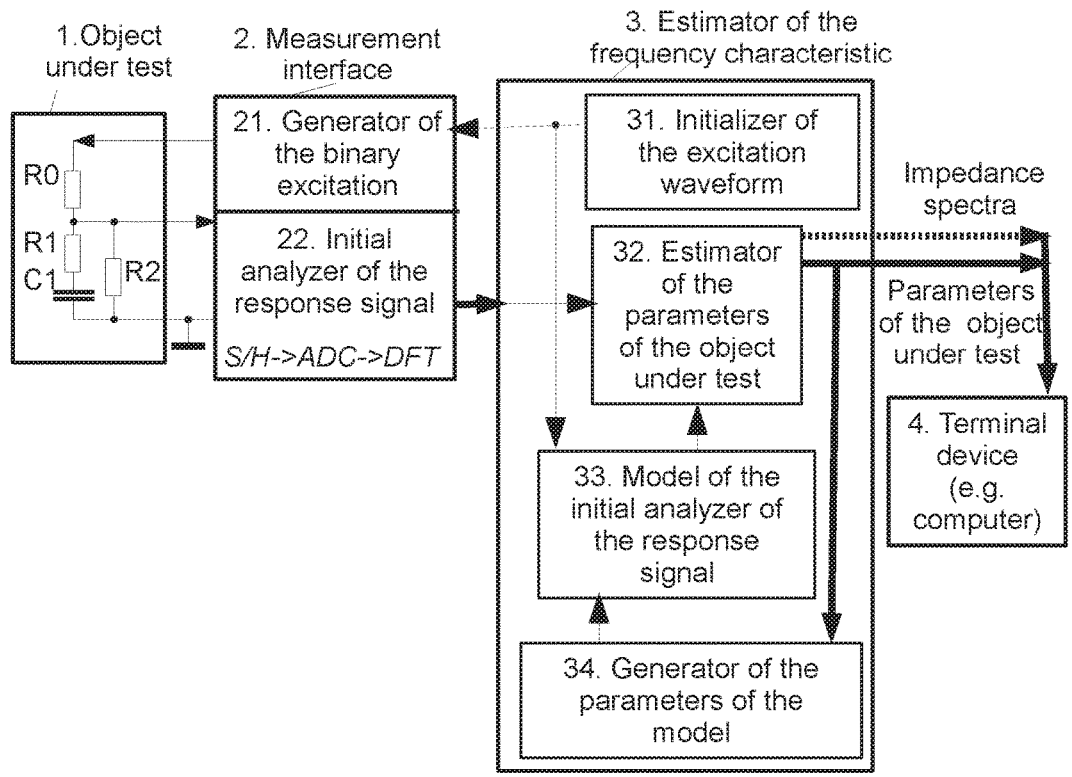
FIG. 1 shows a block diagram of an example embodiment of the invention.

One embodiment of the invention shown on FIG. 1 comprises an object and test 1 and the measurement interface 2, which contains generator of a binary excitation 21 and the initial analyzer of the response signal 22. The generator of the binary excitation 21 stimulates the test object with the signal, containing the desired spectral components, and additionally such a signal (as being pulsed signal) comprising also plenty of other, higher spectral components.
The response signal from the object under test 1 (for example, from the electrical circuit) is processed first by the initial analyzer of the response signal 22, which can contain a sample-and-hold circuit (S/H), an analog-to-digital converter (ADC) and the discrete Fourier transform section (DFT). The latter may be implemented by fast Fourier transform (FFT). The output of the initial analyzer of the response signal 22 results is a preliminary assessment of the spectra of the response signal for the object under test 1 or calculated from this the transfer function of the object under test 1 in the frequency domain or further calculated form this the initial estimation of the impedance spectra of the object under test 1.

The estimator of the frequency characteristic 3 may include the initializer of the excitation waveform 31 of the measurement interface 2, output of which is connected to the input of the generator of the binary excitation 21, allowing initializing binary waveforms with various spectral characteristics by loading the corresponding waveform to the generator of the binary excitation 21.

The estimator of the frequency characteristic 3 contains also
  the estimator of the parameters of the object under test 32, input of which is connected to the output of the initial analyzer of the response signal 22;
  the model of the initial analyzer of the response signal 33, one input of which is connected to the output of the initializer of the excitation waveform 31 (allowing to use the waveform by the said model 33) and output of the said model is connected to the second input of the estimator of the parameters of the object under test 32, allowing the latter to compare the output results of the initial analyzer of the response signal 22 to the output results of the model of the initial analyzer of the response signal 33 and according to these results to estimate the parameters of the model of the system;
  the generator of the parameters of the model 34, input of which is connected to the output of the estimator of the parameters of the object under test 32 (using the latter for the estimation of the parameters of the model of the system) and the said model is connected to the input of the parameters of the model of the initial analyzer of the response signal 33.

Figure 2:
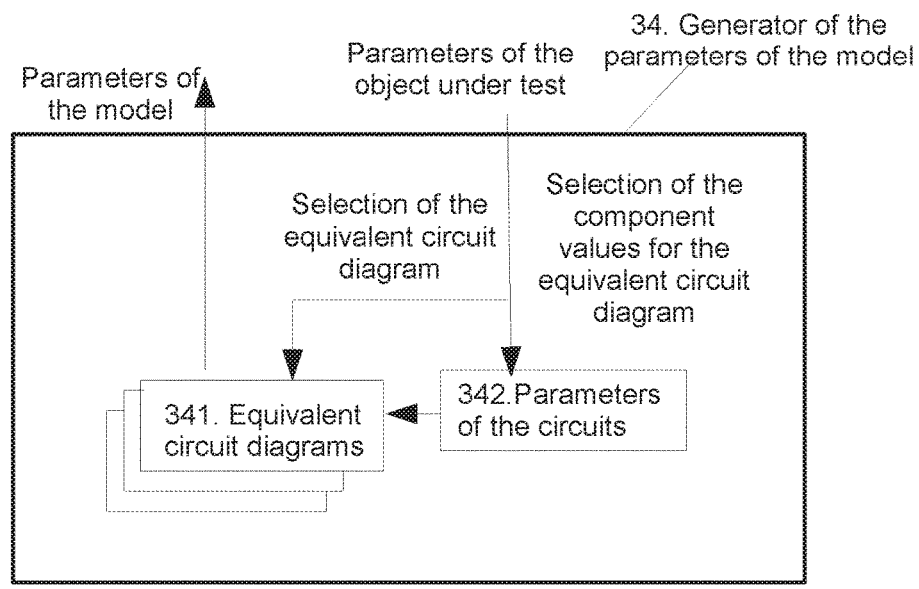
FIG. 2 is a block diagram of the generator of the parameters of the model

The solution may also comprise a terminal device (e.g., a computer) 4, which is connected to the output of the estimator of the parameters of the object under test 32 (being also an output of the overall estimator of the frequency characteristic.
FIG. 2 shows that the generator of the parameters of the model 34 may comprise various equivalent circuit diagrams 341 and parameters 342 of the circuits of these circuit diagrams, corresponding to the object under test 1, representing the possible equivalent circuits (with e.g. LCR-based elements) and their values.

As summarized, the proposed solution can described as follows:
First, the measurement interface 2 calculates the impedance or the transfer function (the complex ratio of the response signal to the excitation signal, at the frequencies of the analysis) for the object under test 1. The obtained result is a rough estimate, because the binary excitation creates significant uncertainties, as explained above.

The estimator of the frequency characteristic 3 contains possible equivalent circuit diagrams and their potential parameters for the object under test 1 (in the generator of the parameters of the model 34) and the model 33 of the measurement interface 2, which takes into account (e.g. by simulation) the non-idealities (also as caused by aliasing) of the initial analyzer of the response signal 22.

The estimator of the parameters of the object under test 32 compares the results of the measurement interface 2 to the results of the model of the initial analyzer of the response signal 33 and searches (if required, iteratively) such input parameters for the generator of the parameters of the model 34 (by selecting the equivalent circuit diagram 341 and the values of components 342 for this equivalent circuit), that these said comparable results are mostly similar. If necessary, in such estimation the convergence of these comparable results may be iterative and multi-step. Thus determined parameters (found equivalent circuit diagram and the values of components) are the output results of the estimator of the frequency characteristic 3.

It is reasonable, that the best similarity of the results of the initial analyzer of the response signal and of the model the initial analyzer of the response signal is determined by the maximum similarity of some parameters of these complex values (modulus, phase, real- or imaginary parts, or a combination thereof), by the lowest standard deviation between these results, achievable.

It could be reasonable that the model of the initial analyzer of the response signal 33 comprises further to the theoretical non-idealities of the measurement interface 2 (e.g., the alias frequencies and their impact), but also other corrections, which are obtained by performing the analysis of the corresponding part by theoretical or experimental studies.

The simplest way to determine these non-idealities (inaccuracies and necessary corrections) of the measurement interface 2 so, that all the analysis (measurement) errors can be determined by one or several known calibration objects (e.g. LCR circuits), and reflecting these non-idealities to the model of the initial analyzer of the response signal 33.

Further, from results of the generator of the parameters of the model 34 impedance spectra or the transfer function (in the frequency domain) of the object under test can be calculated.

Further, from the found transfer functions, impedance spectra or determined equivalent circuits with component values, classifier of the object under test can be determined.

The obtained results may be presented by a terminal device 4, such as a computer.

Figure 3A:
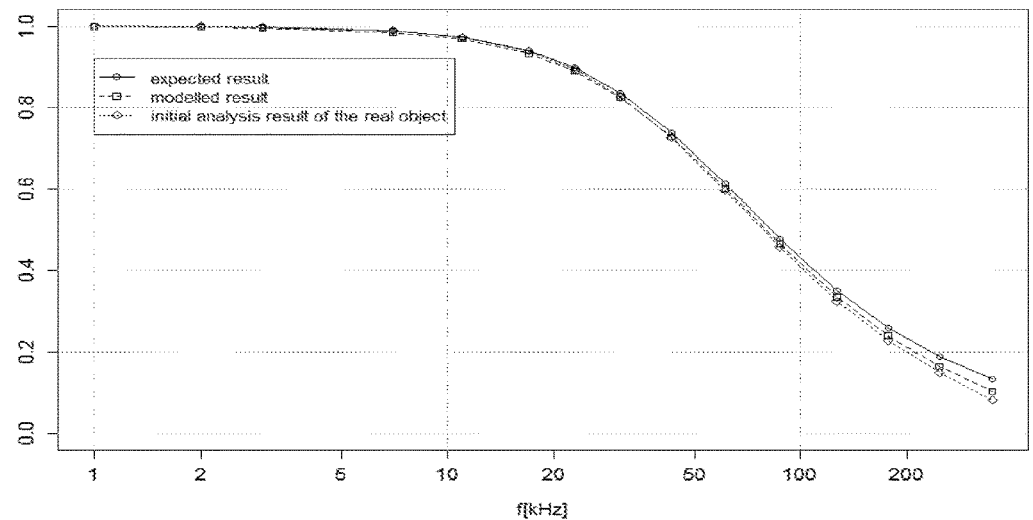
FIG. 3A shows a real-life example based curves of the magnitude of the complex transfer coefficient in the frequency domain, for expected (ideal) result, modelled result of the initial analysis of the response signal and the result of the modelled initial analysis of the response signal, comparably.
Figure 3B:
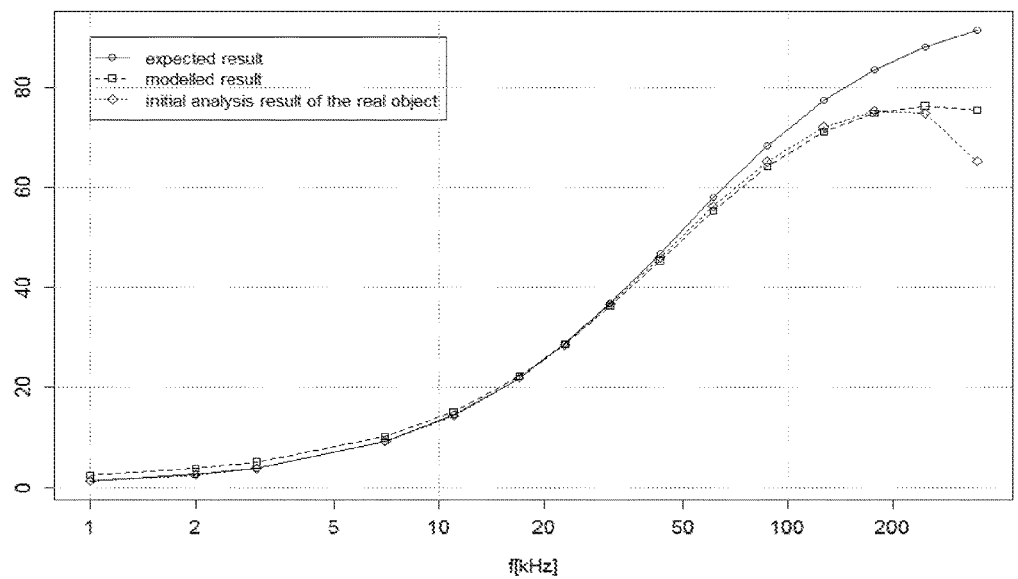
FIG. 3B shows a real-life example based curves of the phase of the complex transfer coefficient in the frequency range, for expected (ideal) result, modelled result of the initial analysis of the response signal and the result of the modelled initial analysis of the response signal, comparably.

FIG. 3A and FIG. 3B show the frequency response transfer curves for one example object under test (the integrating circuit, R=1 kΩ, C=3.3 nF), derived from an analysis of the object, for the magnitude part (FIG. 3A) and the phase (in degrees, FIG. 3B)

As seen in the curves, as well as the module, but especially the phase part has relatively large error after the initial analysis of the response signal.

At the same time, using the same parameters of the analysis of object under test and the same waveform in the modeling of the initial analysis of the response signal gives almost the same error and at most of the points agrees well to the real-life initial analysis of the results and thus the usage of the modelling provides the significant increase in the accuracy of the analysis.

The difference is also seen at high frequencies (about 300 kHz) in the results of the modeling of the preliminary analysis and in the preliminary analysis of the response signal, which is the result of the several additional non-idealities of the initial analyzer of the response signal 22 and such non-idealities is also possible to describe in the model 33, allowing so to further improve the accuracy of analysis.

Figure 4A:
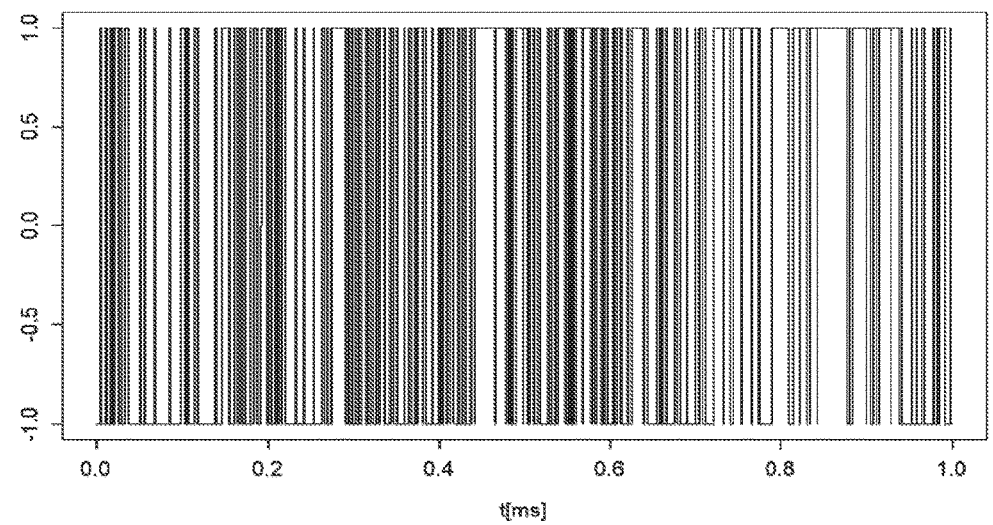
FIG. 4A shows the binary excitation signal, used in the example, in the time domain.
Figure 4B:
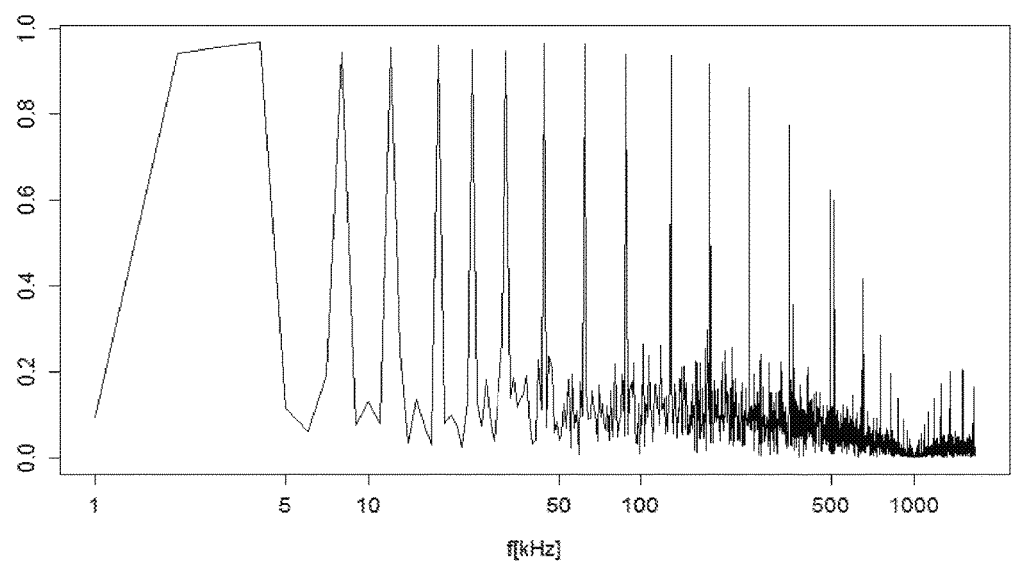
FIG. 4B shows the binary excitation signal, used in the example, in the frequency domain.

The binary excitation signal used in this example, is shown in FIG. 4A (time-domain) and FIG. 4B (frequency domain). The ("useful") frequencies of interest for analysis were selected as following: 1, 2, 3, 7, 11, 17, 23, 31, 43, 61, 87, 127, 177, 247, 349 kHz. Also a number of other (caused by aliasing components) frequencies can be seen in this figure.

The estimator of the frequency characteristic for the described solution (blocks 32, 33, 34 in FIG. 1) may be reasonable to be implemented as a tabulated function. This tabulated function may be 'direct lookup' table, which covers all the possible combinations of output values from the initial analyzer of the response signal 22. Alternatively, the sparser table with interpolation between the table points can be used.

The invention encompasses also the following examples:
1. Method for impedance analyzer with binary excitation that includes the generation of the binary (or using other discrete levels) excitation signal, applied to the object under test, and the initial analysis of the response signal, characterized in that to the solution it is added the frequency characteristic estimation means, comprising:
   estimation of the parameters of the object under test for which the input values are the input values the frequency characteristic estimation means, which are obtained by the initial analysis of the response signal, and the results of which are the output results of the overall frequency characteristic estimation means;
   the generation of the parameters of the model, which are controlled by the output results of the estimation of the parameters of the object under test;
   the model of the initial analysis of the response signal, the parameters for which are determined by the output results of the generation of the parameters of the modelling; and the input for this model is the waveform of the excitation signal,
   and estimation of the parameters of the object under test, controlled by the output results of the model of the initial analysis of the response signal; wherein in the analysis of the parameters of the object under test, such parameters are determined for the model, in which the results of the initial analysis of the response signal are maximally similar to the results of the model of the initial analysis of the response signal.
2. A method according to example 1, characterized in that the parameters of the model include the expected equivalent circuit diagrams and their possible components as electrical values (LCR).
3. A method according to example 1, characterized in that the maximum degree of similarity of the results of the initial analysis of the response signal to the results of the model of the initial analysis of the response signal is determined by standard deviation of some parameters of these complex-valued results (magnitude, phase, real- or imaginary parts, or a combination thereof).
4. A method according to example 1, characterized in that said model of the initial analysis of the response signal contains the corrections for the real initial analysis of the response signal, wherein the mentioned corrections are obtained
5. A method according to example 1, characterized in that the estimation of the frequency-response is performed by the pre-calculated look-up-table.
6. The method according to example 5, characterized in that said look-up-table issues the classification of the object under test, corresponding to the parameters of the object.
7. Device for impedance analyzer with binary excitation that includes the generator of the binary (or using other discrete levels) excitation signal (21), applied to the object under test and the initial analyzer of the response signal (22), characterized in that to the solution it is added the estimator of the frequency characteristic (3) comprising:
- estimator of the parameters of the object under test (32), input of which is also the input of the estimator of the frequency characteristic and connected to the output of the initial analyzer of the response signal (22), and the output of the said estimator of the parameters of the object under test is also the output of the overall the estimator of the frequency characteristic (3);
- generator of the parameters of the model (34), input of which is connected to the output of the estimator of the frequency characteristic (3);
- model of the initial analyzer of the response signal (33), which input for the model parameters is connected to the generator of the parameters of the model (34) and the other input for the said model is connected to the output of the initializer of the excitation signal (31); and the output of said model is connected to the output of the estimator of the parameters of the object under test (32), wherein the estimator of the parameters of the object under test (32) determines such parameters of the object under test, for which the output result of the initial analyzer of the response signal (22) is most similar to the output result of the model of the initial analyzer of the response signal (33), minimizing the difference between them.

What is claimed is:

1. A method for analyzing impedance/transfer function with a binary excitation using a device having impedance analyzer, said method comprises:
- generating a binary excitation signal and applying the binary excitation signal to an object under test using a generator of the binary excitation signal of a measurement interface of the device having impedance analyzer;
- receiving a response signal from the object under test and initially processing and analyzing the response signal to provide initial results including a frequency response signal using an initial analyzer of the measurement interface;
- obtaining estimation parameters of the object under test using the frequency response signal provided by the initial analyzer of the response signal using an estimator of parameters of the object under test of an estimator of frequency characteristics of the device having the impedance analyzer;
- generating parameters of a model based on the obtained estimation parameters, by selecting at least one equivalent circuit diagram, using a generator of parameters of estimator of frequency characteristics;
- generating modelled results of the model of initial analysis of the response signal using a waveform of excitation signal as one input and the generated parameters of the model from the generator of parameters as another input by a model of initial analyzer of the response signal of the estimator of frequency characteristics; and
- estimating the parameters of the object under test using the generated modelled results of the model of the initial analysis by the estimator of parameters of the object under test, and providing the estimated parameters as an output of the estimator of frequency characteristics, including
- the estimated parameters determined for the model, in which the modeling results of the model of the initial analysis of the response signal have a maximum similarity to the initial results of the initial analysis of the response signal with different generated parameters using an iterative multi-step procedure if necessary, wherein the model of the initial analysis of the response signal includes theoretical non-idealities of the measurement interface.

2. The method according to claim 1, wherein the parameters of the model comprise the at least one equivalent circuit diagram selected from a plurality of stored equivalent circuit diagrams and corresponding selected components as electrical values (LCR) for the at least one equivalent circuit diagram.

3. The method according to claim 1, wherein the maximal similarity is determined by standard deviation of corresponding parameters of the modeling and initial results including magnitude, phase, real or imaginary parts, or a combination thereof.

4. The method according to claim 1, wherein said model of the initial analysis of the response signal contains corrections for the initial analysis of the response signal, wherein the corrections are obtained by experiments or theoretically.

5. A device having impedance analyzer, for analyzing impedance/transfer function with a binary excitation, comprises:
- a measurement interface and an estimator of frequency characteristics, wherein the measurement interface comprises a generator of a binary excitation signal, applied to an object under test, and an initial analyzer of a response signal from the object under test to provide initial results including a frequency response signal, and the estimator of frequency characteristic comprises:
- an estimator of parameters of the object under test, input of which comprises the initial results including the frequency response signal and which is also an input of the estimator of frequency characteristic and is connected to an output of the initial analyzer of the response signal, and an output of the estimator of parameters of the object under test is also an output of the estimator of frequency characteristic;
- a generator of parameters of a model based on the obtained estimation parameters by selecting at least one equivalent circuit diagram, input of the generator of parameters of the model is connected to the output of the estimator of frequency characteristic for obtaining the estimation parameters;
- a model of the initial analyzer of the response signal based on having two inputs, a first input being connected to the generator of parameters of the model and a second input being connected to an output of an initializer of a waveform excitation signal; and the output of said model is connected to the input of the estimator of parameters of the object under test, the output comprises generated modelled results of the model of initial analysis of the response signal using input signals from said two inputs,
- wherein the estimator of parameters of the object under test estimates parameters of the object under test using the generated modelled results of the model of the initial analysis, and provides the estimated parameters as an output of the estimator of frequency characteristic, including the estimated parameters determined for the model, in which the modeling results of the model of the initial analysis of the response signal have a maximum similarity to the initial results of the initial analysis of the response signal with different generated parameters using an iterative multi-step procedure if necessary, wherein the model of the initial analysis of the response signal includes theoretical non-idealities of the measurement interface.

6. The method according to claim 5, wherein the estimator of frequency characteristic is implemented as a tabulated function, where estimation of frequency-characteristic is performed using a pre-calculated look-up-table.

7. The method according to claim 6, wherein said look-up-table provides a classification of the object under test, corresponding to the parameters of the object.

* * * * *